US009592523B2

(12) United States Patent
Wetzel et al.

(10) Patent No.: US 9,592,523 B2
(45) **Date of Patent: *Mar. 14, 2017**

(54) LOW FREQUENCY SYNTHETIC JET ACTUATOR AND METHOD OF MANUFACTURING THEREOF

(71) Applicant: General Electric Company, Schenectady, NY (US)

(72) Inventors: Todd Garrett Wetzel, Niskayuna, NY (US); Thomas Elliot Stecher, Scotia, NY (US); Charles Erklin Seeley, Niskayuna, NY (US); Charles Franklin Wolfe, Jr., Albany, NY (US); Yogen Vishwas Utturkar, Niskayuna, NY (US); Bryan Patrick Whalen, Gansevoort, NY (US)

(73) Assignee: General Electric Company, Schenectady, NY (US)

( * ) Notice: Subject to any disclaimer, the term of this patent is extended or adjusted under 35 U.S.C. 154(b) by 272 days.

This patent is subject to a terminal disclaimer.

(21) Appl. No.: 14/490,755

(22) Filed: Sep. 19, 2014

(65) Prior Publication Data

US 2015/0001311 A1 Jan. 1, 2015

Related U.S. Application Data

(63) Continuation of application No. 12/639,103, filed on Dec. 16, 2009, now Pat. No. 8,881,994.

(51) Int. Cl.
*B05B 3/04* (2006.01)
*H05K 7/20* (2006.01)
(Continued)

(52) U.S. Cl.
CPC ............ *B05B 17/0607* (2013.01); *F15D 1/00* (2013.01); *F15D 1/025* (2013.01); *F15D 1/08* (2013.01); *Y10T 29/49401* (2015.01)

(58) Field of Classification Search
USPC ......... 239/102.1, 102.2, 546, 556, 557, 562, 239/563, 564, 566; 361/694, 689, 690,
(Continued)

(56) References Cited

U.S. PATENT DOCUMENTS

| | | | |
|---|---|---|---|
| 3,891,353 | A | 6/1975 | Templeman |
| 4,284,996 | A | 8/1981 | Greve |

(Continued)

FOREIGN PATENT DOCUMENTS

| | | | |
|---|---|---|---|
| JP | H06147104 | A | 5/1994 |

OTHER PUBLICATIONS

Arik, "An investigation into feasibility of impingement heat transfer and acoustic abatement of meso scale synthetic jets," Applied Thermal Engineering, vol. 27, 2007, pp. 1483-1494.

(Continued)

*Primary Examiner* — Justin Jonaitis
(74) *Attorney, Agent, or Firm* — Ziolkowski Patent Solutions Group, SC; Jean K. Testa

(57) ABSTRACT

A system and method for lowering the structural natural frequency of a synthetic jet actuator is disclosed. A synthetic jet actuator is provided that includes a first plate, a second plate spaced apart from the first plate and arranged parallelly thereto, and a spacer element configured to space the first plate apart from the second plate and define a chamber along with the first and second plates. The spacer element includes at least one orifice formed therein such that the chamber is in fluid communication with an environment external to the chamber, and the spacer element is constructed to deform in a bending motion in response to a deflection of at least one of the first and second plates.

20 Claims, 5 Drawing Sheets

(51) Int. Cl.

| | |
|---|---|
| ***B05B 17/06*** | (2006.01) |
| ***F15D 1/00*** | (2006.01) |
| ***F15D 1/02*** | (2006.01) |
| ***F15D 1/08*** | (2006.01) |

(58) Field of Classification Search
USPC ............... 361/692, 695, 697, 271, 277, 278; 165/104.28, 104.33
See application file for complete search history.

(56) References Cited

U.S. PATENT DOCUMENTS

| | | | | |
|---|---|---|---|---|
| 4,308,546 | A | 12/1981 | Halasz | |
| 4,418,354 | A | 11/1983 | Perduijn | |
| 4,667,877 | A | 5/1987 | Yao et al. | |
| 5,758,823 | A | 6/1998 | Glezer et al. | |
| 5,894,990 | A | 4/1999 | Glezer et al. | |
| 5,988,522 | A | 11/1999 | Glezer et al. | |
| 6,056,204 | A | 5/2000 | Glezer et al. | |
| 6,123,145 | A | 9/2000 | Glezer et al. | |
| 6,722,581 | B2 | 4/2004 | Saddoughi | |
| 6,801,430 | B1 | 10/2004 | Pokharna | |
| 7,263,837 | B2 | 9/2007 | Smith | |
| 8,006,917 | B2 * | 8/2011 | Arik .......................... | F15D 1/00 239/102.2 |
| 8,083,157 | B2 * | 12/2011 | Arik ........................ | F23D 14/48 239/102.1 |
| 8,418,934 | B2 | 4/2013 | Arik et al. | |
| 8,752,775 | B2 * | 6/2014 | Arik ...................... | F04B 43/095 239/102.1 |
| 2004/0134653 | A1 | 7/2004 | Khomynets | |
| 2005/0074662 | A1 | 4/2005 | Cho et al. | |
| 2006/0011737 | A1 | 1/2006 | Amenos et al. | |
| 2007/0051827 | A1 * | 3/2007 | Shen ................... | B05B 17/0646 239/102.2 |
| 2008/0174620 | A1 * | 7/2008 | Tanner ................. | B41J 2/14201 347/10 |

OTHER PUBLICATIONS

Utturkar et al., "An Experimental and Computational Heat Transfer Study of Pulsating Jets," Journal of Heat Transfer, vol. 130, Jun. 2008, pp. 062201-1-062201-10.

Garg et al., "Meso Scale Pulsating Jets for Electronics Cooling," pp. 1-25.

Search Report and Written Opinion, EP Application No. 10194272.0, dated Jul. 23, 2013.

Unofficial English Translation of CN Office Action issued Jun. 4, 2014 in connection with CN Patent Application No. 201010615694.1.

* cited by examiner

LOW FREQUENCY SYNTHETIC JET ACTUATOR AND METHOD OF MANUFACTURING THEREOF

CROSS-REFERENCE TO RELATED APPLICATION

The present application is a continuation of, and claims priority to, U.S. non-provisional application Ser. No. 12/639,103, filed Dec. 16, 2009, the disclosure of which is incorporated herein by reference in its entirety.

BACKGROUND OF THE INVENTION

Embodiments of the invention relate generally to synthetic jet actuators and, more particularly, to synthetic jet actuators having an element therein for lowering the structural natural frequency thereof.

Synthetic jet actuators are a widely-used technology that generates a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a control system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a “synthetic jet.”

Referring to FIGS. 1-3, a synthetic jet actuator 10 as known in the art, and the operation thereof, is shown for purposes of describing the general operation of a synthetic jet actuator. The synthetic jet actuator 10 includes a housing 11 defining and enclosing an internal chamber 14. The housing 11 and chamber 14 can take virtually any geometric configuration, but for purposes of discussion and understanding, the housing 11 is shown in cross-section in FIG. 1 to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16. Alternatively, a piezoelectric actuator could be attached to the diaphragm 18. The control system would, in that case, cause the piezoelectric actuator to vibrate and thereby move the diaphragm 18 in time-harmonic motion.

The operation of the synthetic jet actuator 10 is described with reference to FIGS. 2 and 3. FIG. 2 depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

FIG. 3 depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

A drawback of existing synthetic jet designs, such as that shown and described in FIGS. 1-3, is the noise generated from operation of the synthetic jet. Audible noise is inherent in the operation of synthetic jets as a result of the flexible diaphragm being caused to deflect in an alternating motion, and the natural frequencies of the synthetic jet’s various operational modes (structural, disk-bending, and acoustic) impact the amount of noise generated during operation. According to existing designs, a structural natural frequency of a synthetic jet may reach levels of 600 Hz, resulting in a high level of audible noise being generated, which is highly undesirable.

Another drawback of existing synthetic jet designs is the amount of power consumed during operation of the synthetic jet. A high structural natural frequency of the synthetic jet corresponds to a higher amount of power that is needed to be provided to the synthetic jet to deflect the diaphragm. High rates of power consumption not only increase the cost of operating the synthetic jet, but also decrease the efficiency of the synthetic jet. For example, when the synthetic jet is used as a cooling device, convection cooling is negatively affected by high rates of power consumption, as such increased power consumption generates unwanted heat.

The noise level and rates of power consumption are both a result of the natural frequency of the synthetic jet’s maximum deflection, which in turn is a result of the material properties and shape of components in the synthetic jet actuator. Specifically, the shape of components in existing synthetic jet actuators results is an increased spring constant associated therewith, thereby leading to an increased structural natural frequency of the synthetic jet actuator.

Accordingly, it is desirable to provide a synthetic jet having a low structural natural frequency in order to reduce the amount of noise generated from operation of the synthetic jet and to lower the amount of power consumed during operation of the synthetic jet.

BRIEF DESCRIPTION OF THE INVENTION

Embodiments of the invention overcome the aforementioned drawbacks by providing a synthetic jet actuator and method of manufacturing thereof. A spacer element is provided between deflecting plates of the synthetic jet actuator that deforms in a bending motion when the first and second plates are caused to deflect, thereby lowering a structural natural frequency of the synthetic jet actuator.

In accordance with one aspect of the invention, a synthetic jet actuator includes a first plate, a second plate spaced apart from the first plate and arranged parallelly thereto, and a spacer element configured to space the first plate apart from the second plate and define a chamber along with the first and second plates. The spacer element includes at least one orifice formed therein such that the chamber is in fluid communication with an environment external to the chamber and the spacer element is constructed to deform in a bending motion in response to a deflection of at least one of the first and second plates.

In accordance with another aspect of the invention, a method of manufacturing a synthetic jet actuator includes providing a pair of synthetic jet plates comprising a first plate and a second plate and attaching a spacing member to the pair of synthetic jet plates to maintain the first plate and the second plate in a spaced apart relationship and so as to define a chamber. The spacing member is configured to bendingly deform in response to the deflection of the first and second plates and includes at least one orifice formed therein such that the chamber is in fluid communication with an external environment. The method also includes coupling an actuator element to at least one of the first and second plates to selectively cause deflection thereof, thereby changing a volume within the chamber so that a series of fluid vortices are generated and projected to the external environment from the at least one orifice of the spacer element.

In accordance with yet another aspect of the invention, a synthetic jet actuator includes a first plate and a second plate spaced apart from the first plate and arranged parallelly thereto. The synthetic jet actuator also includes a spacer element configured to maintain the first plate and the second plate in a spaced apart relationship so as to define a chamber, the spacer element having at least one orifice therein such that the chamber is in fluid communication with an external environment. The synthetic jet actuator further includes an actuator element coupled to at least one of the first and second plates to selectively cause deflection thereof, thereby changing a volume within the chamber so that a series of fluid vortices are generated and projected to the external environment from the at least one orifice of the spacer element. The spacer element of the synthetic jet actuator comprises a pliant member configured to deflect in a bending motion in response to the deflection of the first and second plates.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Embodiments of the invention provide a synthetic jet actuator and method of manufacturing thereof. A spacer element is provided between deflecting plates of the synthetic jet actuator that deforms in a bending motion when the first and second plates are caused to deflect, thereby lowering a structural natural frequency of the synthetic jet actuator.

Figure 1:
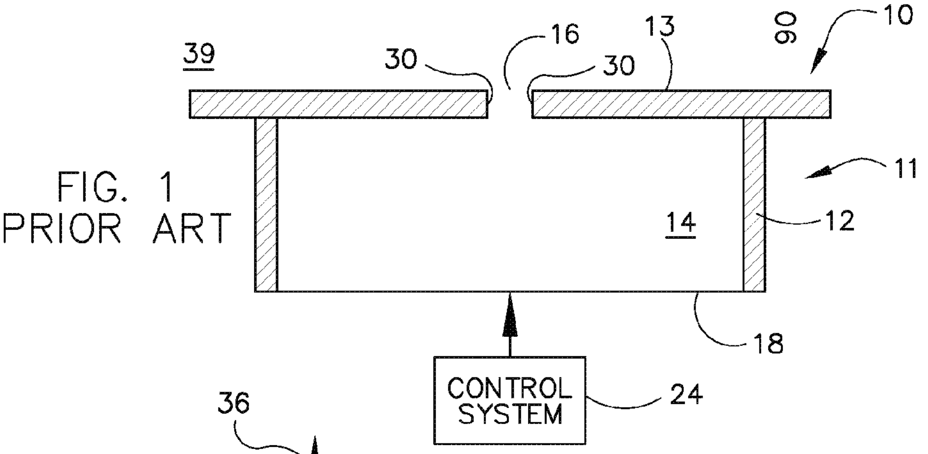
FIG. 1 PRIOR ART
FIG. 1 is a cross-section of a prior art zero net mass flux synthetic jet actuator with a control system.
Figure 2:
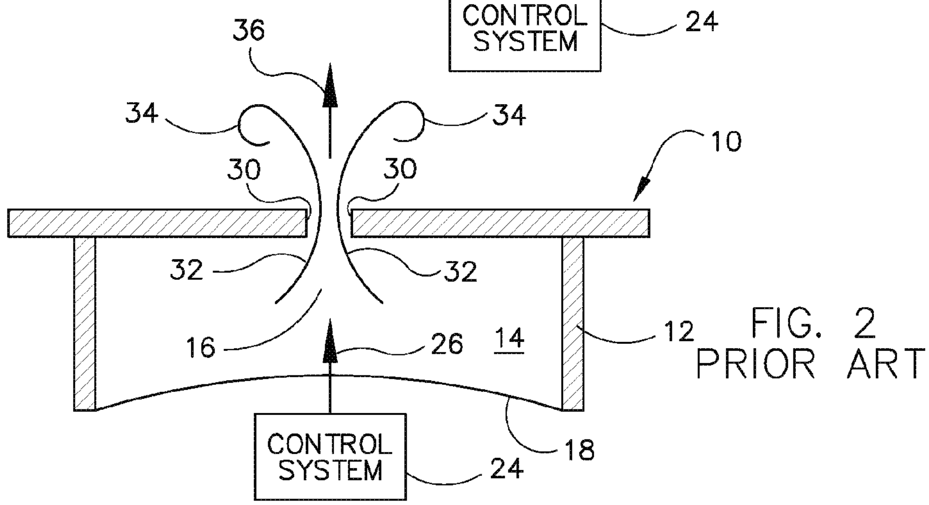
FIG. 2 PRIOR ART
FIG. 2 is a cross-section of the synthetic jet actuator of FIG. 1 depicting the jet as the control system causes the diaphragm to travel inward, toward the orifice.
Figure 3:
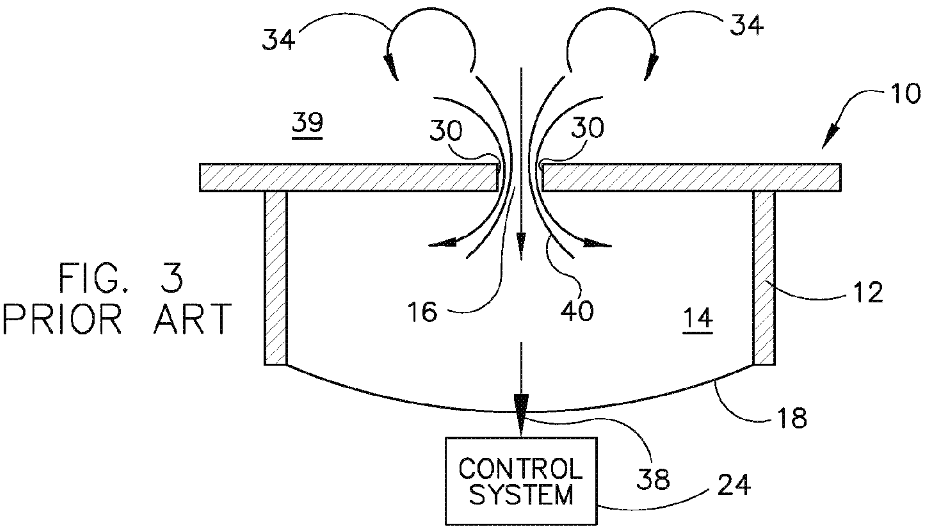
FIG. 3 PRIOR ART
FIG. 3 is a cross-section of the synthetic jet actuator of FIG. 1 depicting the jet as the control system causes the diaphragm to travel outward, away from the orifice.
Figure 4A:
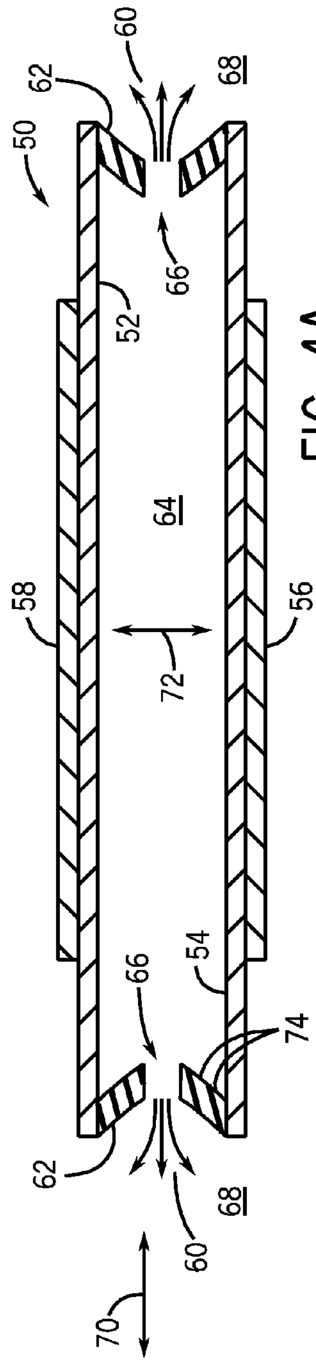
FIGS. 4A to 4C are schematic cross-sectional side views and a front elevational view of a synthetic jet actuator according to an embodiment of the invention.
Figure 4C:
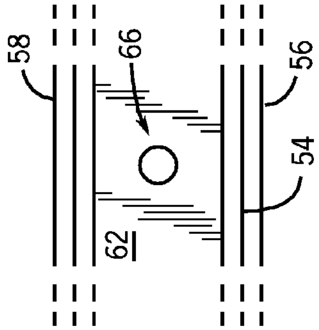
Figure 4B:
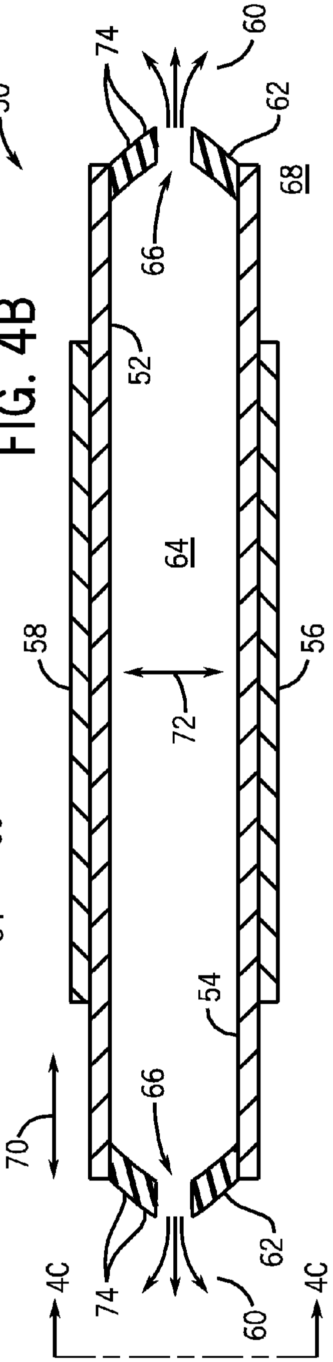

Referring now to FIGS. 4A to 4C, a synthetic jet actuator 50 is shown according to embodiments of the invention. The synthetic jet actuator 50 includes a pair of synthetic jet plates 52, 54, shown in FIGS. 4A to 4C as a first plate 52 and an opposing second plate 54 arranged parallel thereto. Attached to at least one of the first and second plates 52, 54, or to both of the first and second plates as shown in FIGS. 4A to 4C, are actuator elements 56, 58 configured to cause displacement of the plates. In an exemplary embodiment, actuator elements 56, 58 comprise piezoelectric elements (e.g., piezoelectric disks) that are configured to periodically receive an electric charge from a controller/power source (not shown), and undergo mechanical stress and/or strain responsive to the charge. The stress/strain of piezoelectric elements 56, 58 causes deflection of first and second plates 52, 54 such that, for example, a time-harmonic motion or vibration of the plates is achieved. It is recognized that the piezoelectric elements 56, 58 coupled to the first and second plates 52, 54, respectively, can be selectively controlled to cause vibration of one or both of the plates so as to control the volume and velocity of a synthetic jet stream 60 expelled from the synthetic jet actuator 50.

The first and second plates 52, 54 are maintained in a spaced apart relationship by a spacer element 62 positioned therebetween. The combination of first and second plates 52, 54 and spacer element 62 define a chamber or volume 64 within the synthetic jet actuator 50. The spacer element 62 includes therein one or more orifices 66 to place the chamber 64 in fluid communication with a surrounding, external environment 68. As shown in FIGS. 4A to 4C, a pair of orifices 66 is formed in spacer element 62 to allow for the drawing in and exhaustion of an ambient fluid into and out of the synthetic jet actuator 50, although it is recognized that a greater or lesser number of orifices could be formed in spacer element 62 (e.g., 1, 3, or 4 orifices, for example). As set forth above, the piezoelectric elements 56, 58 coupled to the first and second plates 52, 54 are selectively controlled to cause vibration of one or both of the plates so as to control the volume and velocity of synthetic jet stream 60 expelled from one or both of the orifices 66.

As shown in FIG. 4A, according to one embodiment, spacer element 62 of synthetic jet actuator 50 is formed as a flexible wall member (i.e., flexible ring) having a concave shape when at rest. That is, spacer element 62 is formed to have a concave shape absent from any deflection of the plates 52, 54 induced by actuator elements 56, 58. The flexible wall member 62 is constructed such that, upon deflection of the plates 52, 54 induced by actuator elements 56, 58, the flexible wall member 62 is caused to deform in an inward and outward bending motion. The inward and outward bending motion of flexible wall member 62 is in a direction perpendicular to a direction of the deflection of the first and second plates 52, 54, as indicated by arrow 70 (indicating the inward and outward bending direction) and arrow 72 (indicating the direction of deflection of the plates), respectively. The concave structure of flexible wall member 62, and the inward and outward bending motion thereof upon deflection of the plates induced by actuator elements 56, 58, provides a spacer element having a low spring constant. The low spring constant of flexible wall member 62 acts to reduce a natural frequency of synthetic jet actuator 50 at a maximum deflection of the first and second plates 52, 54, thereby allowing the synthetic jet actuator 50 to operate at a low frequency and reduce associated noise output and power consumption.

As shown in FIG. 4B, according to one embodiment, spacer element 62 of synthetic jet actuator 50 is formed as a flexible wall member (i.e., flexible ring) having a convex shape when at rest. That is, spacer element 62 is formed to have a convex shape absent from any deflection of the plates 52, 54 induced by actuator elements 56, 58. The flexible wall member 62 is constructed such that, upon deflection of the plates 52, 54 induced by actuator elements 56, 58, the flexible wall member 62 is caused to deform in an inward and outward bending motion, as indicated by arrow 70. The convex structure of flexible wall member 62, and the inward and outward bending motion thereof upon deflection of the plates induced by actuator elements 56, 58, provides a spacer element having a low spring constant, thereby reducing a natural frequency of synthetic jet actuator 50.

According to an exemplary embodiment of the invention, flexible wall member 62 is formed from an array compliant elastomer layers 74 arranged in either a concave (FIG. 4A) or convex (FIG. 4B) arrangement. For example, an array of silicone layers may be provided that are layered on one another to provide a concave or convex shaped flexible wall member/ring, with at least some of the layers 74 having a gap formed therein that collectively form orifice 66. It is also recognized that other flexible materials such as polycarbonate and Kapton, for example, could also be used to form the layers 74 of flexible wall member 62.

In each of the embodiments of the synthetic jet actuator 50 of FIGS. 4A and 4B, it is recognized that flexible wall member 62 deforms in a bending motion in response to deflection of the plates 52, 54 induced by actuator elements 56, 58 rather than a compression and expansion type of deformation. That is, a spacing element formed as a solid ring of beaded material, for example, would undergo compression and expansion deformation in response to deflection of the plates 52, 54 induced by actuator elements 56, 58 rather than the bending deformation undergone by flexible wall member 62. The bending deformation/translation of flexible wall member 62 provides a spacing element having a lower spring constant than a spacer member that undergoes compression/expansion deformation, thereby reducing a natural frequency of synthetic jet actuator 50.

Figure 5:
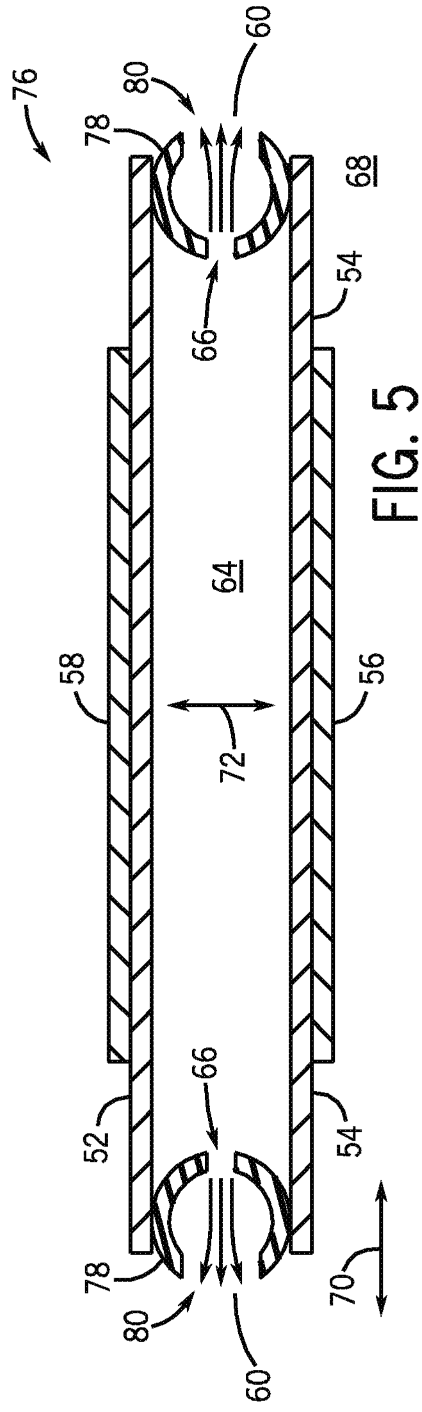
FIG. 5 is a schematic cross-sectional side view of a synthetic jet actuator according to an embodiment of the invention.

Referring now to FIG. 5, a synthetic jet actuator 76 is shown according to another embodiment of the invention. The synthetic jet actuator 76 includes a first synthetic jet plate 52 and an opposing second synthetic jet plate 54 arranged parallel thereto. Attached to at least one of the first and second plates 52, 54, or to both of the first and second plates as shown in FIG. 5, are actuator elements 56, 58 configured to cause displacement of the plates. In an exemplary embodiment, actuator elements 56, 58 comprise piezoelectric elements (e.g., piezoelectric disks) that are configured to periodically receive an electric charge from a controller/power source (not shown), and undergo mechanical stress and/or strain responsive to the charge. The stress/strain of piezoelectric elements 56, 58 causes deflection of first and second plates 52, 54 such that, for example, a time-harmonic motion or vibration of the plates is achieved. It is recognized that the piezoelectric elements 56, 58 coupled to the first and second plates 52, 54, respectively, can be selectively controlled to cause vibration of one or both of the plates so as to control the volume and velocity of a synthetic jet stream 60 expelled from the synthetic jet actuator 76.

The first and second plates 52, 54 and maintained in a spaced apart relationship by a spacer element 78 positioned therebetween. The combination of first and second plates 52, 54 and spacer element 78 define a chamber or volume 64 within the synthetic jet actuator 76. The spacer element 78 includes therein one or more orifices 66 to place the chamber 64 in fluid communication with a surrounding, external environment 68. As shown in FIG. 5, a pair of orifices 66 is formed in spacer element 78 to allow for the drawing in and exhaustion of an ambient fluid into and out of the synthetic jet actuator 76. That is, as set forth above, the piezoelectric elements 56, 58 coupled to the first and second plates 52, 54 are selectively controlled to cause vibration of one or both of the plates so as to control the volume and velocity of synthetic jet stream 60 expelled from one or both of the orifices 66.

As shown in FIG. 5, according to an embodiment of the invention, spacer element 78 of synthetic jet actuator 76 is formed as a half-section tube or a tube having a slit formed therein. The spacer element 78 may be formed from vascular tubing (made with silicone or other compliant materials) or an o-ring, for example, that is cut in half or has a slit 80 cut therein. The half-section tube 78 is thus constructed such that, upon deflection of the plates 52, 54 induced by actuator elements 56, 58, the half-section tube 78 is caused to deform in an inward and outward bending motion. The inward and outward bending motion of half-section tube 78 is in a direction perpendicular to a direction of the deflection of the first and second plates 52, 54, as indicated by arrow 70 (indicating the inward and outward bending direction) and arrow 72 (indicating the direction of deflection of the plates), respectively. The structure of half-section tube 78, and the inward and outward bending motion thereof upon deflection of the plates induced by actuator elements 56, 58, provides a spacer element having a low spring constant. The low spring constant of half-section tube 78 acts to reduce a natural frequency of synthetic jet actuator 76 at a maximum deflection of the first and second plates 52, 54, thereby allowing the synthetic jet actuator 76 to operate at a low frequency and reduce associated noise output and power consumption.

Figure 6:
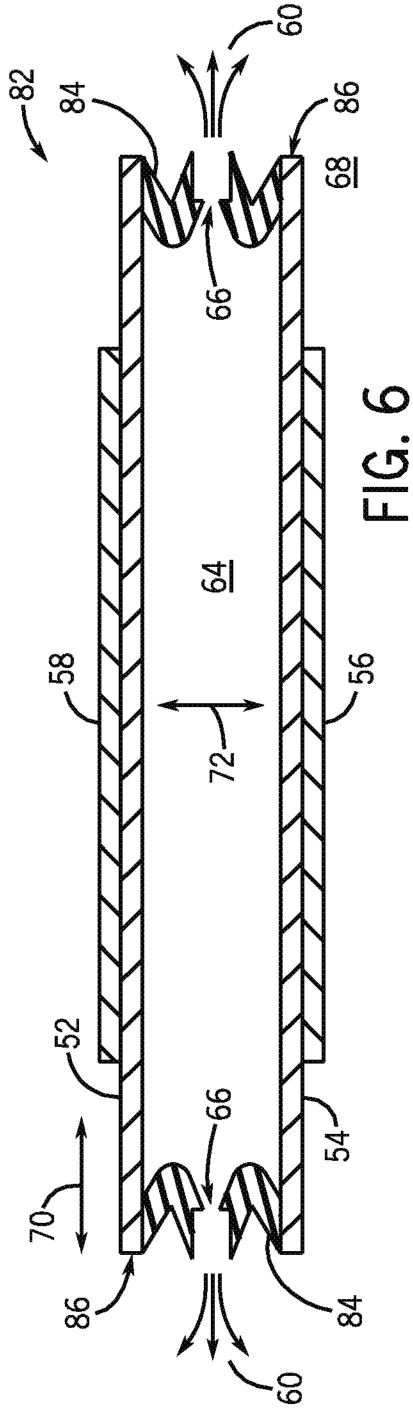
FIG. 6 is a schematic cross-sectional side view of a synthetic jet actuator according to an embodiment of the invention.

Referring now to FIG. 6, according to another embodiment of the invention, a synthetic jet actuator 82 is provided having a spacer element 84 formed as a bellows-shaped flexible wall. The bellows-shaped flexible wall 84 is positioned between the first and second plates 52, 54 inside an outer edge 86 thereof (i.e., an "inner bellows"). The bellows-shaped flexible wall 84 is constructed to have a plurality of pliable folds therein such that, upon deflection of the plates 52, 54 induced by actuator elements 56, 58, the bellows-shaped flexible wall 84 is caused to deform in an inward and outward bending motion. The inward and outward bending motion of bellows-shaped flexible wall 84 is in a direction perpendicular to a direction of the deflection of the first and second plates 52, 54, as indicated by arrow 70 (indicating the inward and outward bending direction) and arrow 72 (indicating the direction of deflection of the plates), respectively. The structure of bellows-shaped flexible wall 84, and the inward and outward bending motion thereof upon deflection of the plates induced by actuator elements 56, 58, provides a spacer element having a low spring constant. The low spring constant of bellows-shaped flexible wall 84 acts to reduce a natural frequency of synthetic jet actuator 82 at a maximum deflection of the first and second plates 52, 54, thereby allowing the synthetic jet actuator 82 to operate at a low frequency and reduce associated noise output and power consumption.

Figure 7:
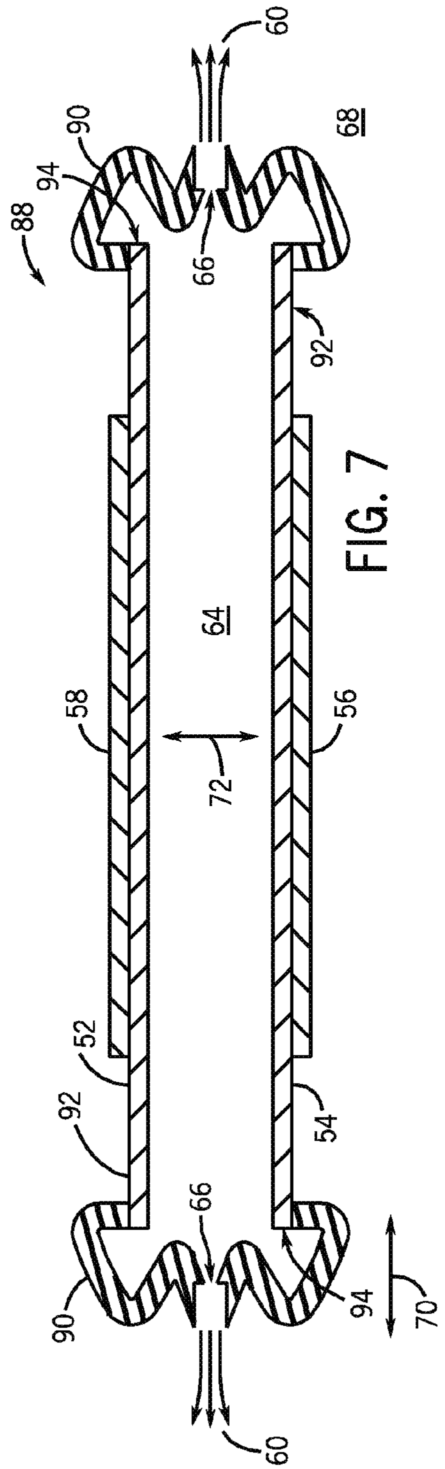
FIG. 7 is a schematic cross-sectional side view of a synthetic jet actuator according to an embodiment of the invention.

Referring now to FIG. 7, a synthetic jet actuator 88 is shown according to another embodiment of the invention. The synthetic jet actuator 88 includes therein a spacer element 90 formed as a bellows-shaped flexible wall that is configured to maintain plate 52 and plate 54 in a spaced apart relationship. As shown in FIG. 7, bellows-shaped flexible wall 90 is attached to an outer surface 92 of each of the first and second plates 52, 54 adjacent an outer perimeter 94 thereof (i.e., an "outer bellows"). The bellows-shaped flexible wall 90 extends out from first and second plates 52, 54 such that a height thereof is greater than a separation distance between the first and second plates. The bellows-shaped flexible wall 90 also extends out from first and second plates 52, 54 past the outer perimeter 94 thereof, such that a horizontal dimension (in direction 70) of the overall synthetic jet actuator 88 is increased. The bellows-shaped flexible wall 90 is constructed to have a plurality of pliable folds therein such that, upon deflection of the plates 52, 54 induced by actuator elements 56, 58, the bellows-shaped flexible wall 84 is caused to deform in an inward and outward bending motion. The inward and outward bending motion of bellows-shaped flexible wall 90 is in a direction 70 perpendicular to a direction 72 of the deflection of the first and second plates 52, 54 and acts to reduce a natural frequency of synthetic jet actuator 88 at a maximum deflection of the first and second plates 52, 54, thereby allowing the synthetic jet actuator 88 to operate at a low frequency and reduce associated noise output and power consumption.

Figure 8:
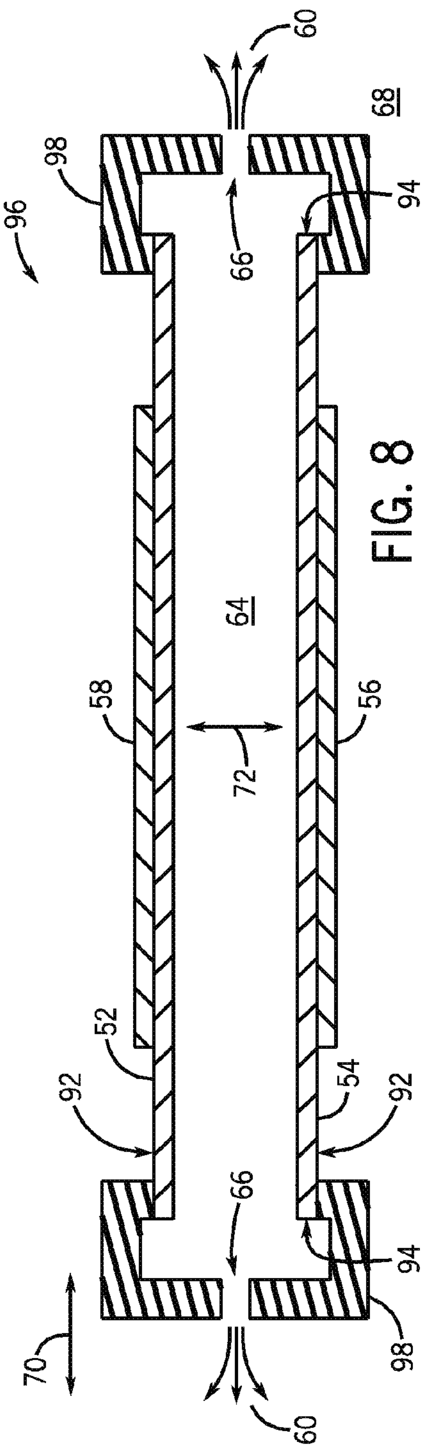
FIG. 8 is a schematic cross-sectional side view of a synthetic jet actuator according to an embodiment of the invention.

Referring now to FIG. 8, according to another embodiment of the invention, a synthetic jet actuator 96 is provided having a spacer element 98 formed as a box-shaped flexible wall structure that is configured to maintain plate 52 and plate 54 in a spaced apart relationship. As shown in FIG. 8, flexible wall structure 98 is attached to the outer surface 92 of each of the first and second plates 52, 54 adjacent the outer perimeter 94 thereof. The flexible wall structure 98 extends out from first and second plates 52, 54 such that a height thereof is greater than a separation distance between the first and second plates. The flexible wall structure 98 also extends out from first and second plates 52, 54 past the outer perimeter 94 thereof, such that a horizontal dimension (in direction 70) of the overall synthetic jet actuator 96 is increased. The flexible wall structure 98 is constructed such that, upon deflection of the plates 52, 54 induced by actuator elements 56, 58, the flexible wall structure 98 is caused to deform in an inward and outward bending motion. The inward and outward bending motion of flexible wall structure 98 is in a direction 70 perpendicular to a direction 72 of the deflection of the first and second plates 52, 54 and acts to reduce a natural frequency of synthetic jet actuator 96 at a maximum deflection of the first and second plates 52, 54, thereby allowing the synthetic jet actuator 96 to operate at a low frequency and reduce associated noise output and power consumption.

Figure 9:
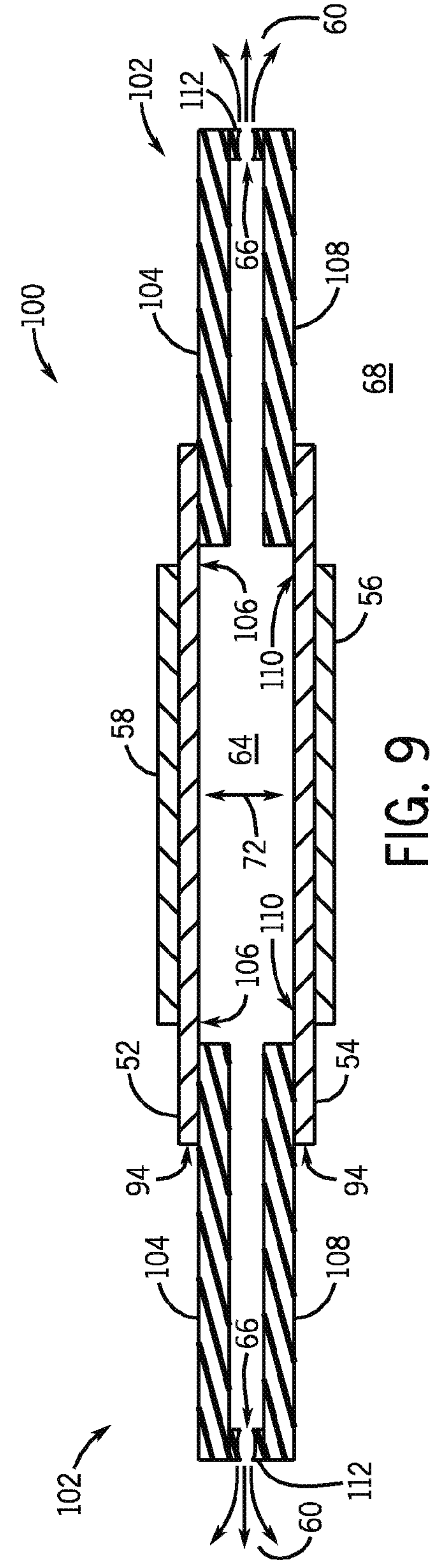
FIG. 9 is a schematic cross-sectional side view of a synthetic jet actuator according to an embodiment of the invention.

Referring now to FIG. 9, a synthetic jet actuator 100 is shown according to another embodiment of the invention. The synthetic jet actuator 100 includes therein a spacer element 102 formed as a composite spacer element that is configured to maintain plate 52 and plate 54 in a spaced apart relationship. The composite spacer element 102 includes a first flexible extension member 104 attached to an inner surface 106 of the first plate 52 that extends outward past an outer perimeter 94 thereof and a second flexible extension member 108 attached to an inner surface 110 of the second plate 54 and extending outward past an outer perimeter 94 thereof. A rigid wall member 112 having orifices 66 formed therein is positioned between first flexible extension member 104 and second flexible extension member 108 to maintain the first and second flexible extension members in a spaced apart relationship. The composite spacer element 102 is constructed such that, upon deflection of the plates 52, 54 induced by actuator elements 56, 58, first flexible extension member 104 and second flexible extension member 108 are caused to deform in an upward and downward bending motion. The upward and downward bending motion of first flexible extension member 104 and second flexible extension member 108 is in a direction 72 parallel to a direction 72 of the deflection of the first and second plates 52, 54, and acts to reduce a natural frequency of synthetic jet actuator 100 at a maximum deflection of the first and second plates 52, 54, thereby allowing the synthetic jet actuator 100 to operate at a low frequency and reduce associated noise output and power consumption.

While the synthetic jet actuators of FIGS. 4-9 are shown and described as having multiple orifices therein, it is also envisioned that embodiments of the invention could be used with single orifice synthetic jet actuators. Additionally, while the synthetic jet actuators of FIGS. 4-9 are shown and described as having an actuator element included on each of first and second plates, it is also envisioned that embodiments of the invention could include only a single actuator element positioned on one of the plates.

Beneficially, embodiments of the synthetic jet actuators shown in FIGS. 4-9 incorporate a spacer element/member therein that functions to lower a structural natural operating frequency of the synthetic jet actuator. According to the embodiments set forth above, the structural natural operating frequency of the synthetic jet actuator is at or below 400 Hz, as compared to prior art synthetic jet actuators that can typically operate at a structural natural operating frequency of 600 Hz or more. Additionally, the level of acoustic noise generated during operation of the synthetic jet actuators set forth above is also lowered based on the structure/design of the spacer elements incorporated therein. The acoustic noise levels associated with operation of the synthetic jet actuators is at or below a level of 27 dBA, as compared to prior art synthetic jet actuators that can typically operate at a noise level of 32 dBA or more.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a synthetic jet actuator includes a first plate, a second plate spaced apart from the first plate and arranged parallelly thereto, and a spacer element configured to space the first plate apart from the second plate and define a chamber along with the first and second plates. The spacer element includes at least one orifice formed therein such that the chamber is in fluid communication with an environment external to the chamber and the spacer element is constructed to deform in a bending motion in response to a deflection of at least one of the first and second plates.

According to another embodiment of the invention, a method of manufacturing a synthetic jet actuator includes providing a pair of synthetic jet plates comprising a first plate and a second plate and attaching a spacing member to the pair of synthetic jet plates to maintain the first plate and the second plate in a spaced apart relationship and so as to define a chamber. The spacing member is configured to bendingly deform in response to the deflection of the first and second plates and includes at least one orifice formed therein such that the chamber is in fluid communication with an external environment. The method also includes coupling an actuator element to at least one of the first and second plates to selectively cause deflection thereof, thereby changing a volume within the chamber so that a series of fluid vortices are generated and projected to the external environment from the at least one orifice of the spacer element.

According to yet another embodiment of the invention, a synthetic jet actuator includes a first plate and a second plate spaced apart from the first plate and arranged parallelly thereto. The synthetic jet actuator also includes a spacer element configured to maintain the first plate and the second plate in a spaced apart relationship so as to define a chamber, the spacer element having at least one orifice therein such that the chamber is in fluid communication with an external environment. The synthetic jet actuator further includes an actuator element coupled to at least one of the first and second plates to selectively cause deflection thereof, thereby changing a volume within the chamber so that a series of fluid vortices are generated and projected to the external environment from the at least one orifice of the spacer element. The spacer element of the synthetic jet actuator comprises a pliant member configured to deflect in a bending motion in response to the deflection of the first and second plates.

What is claimed as new and desired to be protected by Letters Patent of the United States is:

1. A synthetic jet actuator comprising:

a first plate;

a second plate spaced apart from the first plate and arranged parallelly thereto; and a spacer element configured to space the first plate apart from the second plate and defining a chamber along with the first and second plates, the spacer element having a pair of orifices formed therein such that the chamber is in fluid communication with an environment external to the chamber, with each of the pair of orifices acting as an inlet and outlet between the chamber and the environment external to the chamber;

wherein the spacer element is constructed to deform in a bending motion in response to a deflection of at least one of the first and second plates.

2. The synthetic jet actuator of claim 1 wherein the spacer element is constructed to deform in an inward and outward bending motion when at least one of the first and second plates is caused to deflect, the inward and outward bending motion being in a direction perpendicular to a direction of the deflection of the at least one of the first and second plates.

3. The synthetic jet actuator of claim 2 wherein the spacer element comprises a multi-layered compliant elastomer structure.

4. The synthetic jet actuator of claim 2 wherein the spacer element comprises one of a convex-shaped flexible wall positioned between the first and second plates and a concave-shaped flexible wall positioned between the first and second plates, the one of the convex-shaped flexible wall and the concave-shaped flexible wall being configured to deform in the inward and outward bending motion.

5. The synthetic jet actuator of claim 2 wherein the spacer element comprises a bellows-shaped flexible wall positioned between the first and second plates and being configured to deform in the inward and outward bending motion.

6. The synthetic jet actuator of claim 2 wherein the spacer element comprises a bellows-shaped flexible wall attached to an outer surface of each of the first and second plates along an outer perimeter thereof, the bellows-shaped flexible wall extending outward past the outer perimeter of the first and second plates and being configured to deform in the inward and outward bending motion.

7. The synthetic jet actuator of claim 2 wherein the spacer element comprises a box-shaped flexible wall structure attached to an outer surface of each of the first and second plates along an outer perimeter thereof, the box-shaped flexible wall structure extending outward past the outer perimeter of the first and second plates and being configured to deform in the inward and outward bending motion.

8. The synthetic jet actuator of claim 2 wherein the spacer element comprises a hollow tube having a slit formed therein, the hollow tube configured to deform in the inward and outward bending motion.

9. The synthetic jet actuator of claim 1 wherein the spacer element comprises:

a first flexible extension member attached to an inner surface of the first plate and extending outward past an outer perimeter of the first plate;

a second flexible extension member attached to an inner surface of the second plate and extending outward past an outer perimeter of the second plate; and a rigid wall positioned between the first flexible extension member and the second flexible extension member to maintain the first flexible extension member and the second flexible extension member in a spaced apart relationship, the rigid wall having the pair of orifices formed therein;

wherein the first flexible extension member and the second flexible extension member are constructed to deform in an upward and downward bending motion when at least one of the first and second plates is caused to deflect, the upward and downward bending motion being in a direction parallel to a direction of the deflection of the at least one of the first and second plates.

10. The synthetic jet actuator of claim 1 further comprising an actuator element coupled to at least one of the first and second plates to selectively cause deflection thereof in a direction of deflection, thereby changing a volume within the chamber so that a series of fluid vortices are generated and projected to the external environment out from the pair of orifices of the spacer element.

11. The synthetic jet actuator of claim 10 wherein the bending motion of the spacer element causes each of the pair of orifices to move in a direction perpendicular to the direction of deflection.

12. A synthetic jet actuator comprising:

a first plate;

a second plate spaced apart from the first plate and arranged parallelly thereto;

a spacer element configured to space the first plate apart from the second plate and defining a chamber along with the first and second plates, the spacer element having at least one orifice formed therein such that the chamber is in fluid communication with an environment external to the chamber; and an actuator element coupled to at least one of the first and second plates to selectively cause deflection thereof in a direction of deflection wherein the spacer element is constructed to deform in a bending motion in response to a deflection of at least one of the first and second plates, with the bending motion of the spacer element causing the at least one orifice to move in a direction perpendicular to the direction of deflection.

13. The synthetic jet actuator of claim 12 wherein the spacer element comprises a multi-layered compliant elastomer structure.

14. The synthetic jet actuator of claim 12 wherein the spacer element comprises one of a convex-shaped flexible wall positioned between the first and second plates and a concave-shaped flexible wall positioned between the first and second plates, the one of the convex-shaped flexible wall and the concave-shaped flexible wall being configured to deform in the bending motion.

15. The synthetic jet actuator of claim 12 wherein the spacer element comprises a bellows-shaped flexible wall positioned between the first and second plates and being configured to deform in the bending motion.

16. The synthetic jet actuator of claim 12 wherein the spacer element comprises a bellows-shaped flexible wall attached to an outer surface of each of the first and second plates along an outer perimeter thereof, the bellows-shaped flexible wall extending outward past the outer perimeter of the first and second plates and being configured to deform in the bending motion.

17. The synthetic jet actuator of claim 12 wherein the spacer element comprises a box-shaped flexible wall structure attached to an outer surface of each of the first and second plates along an outer perimeter thereof, the box-shaped flexible wall structure extending outward past the outer perimeter of the first and second plates and being configured to deform in the bending motion.

18. The synthetic jet actuator of claim 12 wherein the spacer element comprises a hollow tube having a slit formed therein, the hollow tube configured to deform in the bending motion.

19. The synthetic jet actuator of claim 12 wherein the spacer element comprises:

a first flexible extension member attached to an inner surface of the first plate and extending outward past an outer perimeter of the first plate;

a second flexible extension member attached to an inner surface of the second plate and extending outward past an outer perimeter of the second plate; and a rigid wall positioned between the first flexible extension member and the second flexible extension member to maintain the first flexible extension member and the second flexible extension member in a spaced apart relationship, the rigid wall having the pair of orifices formed therein;

wherein the first flexible extension member and the second flexible extension member are constructed such that the bending motion thereof comprises a deforming in an upward and downward bending motion when at least one of the first and second plates is caused to deflect, the upward and downward bending motion being in a direction parallel to a direction of the deflection of the at least one of the first and second plates; and wherein the at least one orifice moves in the direction perpendicular to the direction of deflection responsive to the upward and downward bending motion of the spacer element.

20. A synthetic jet actuator comprising:

a planar first plate;

a planar second plate spaced apart from the first plate and arranged parallelly thereto;

a spacer element configured to maintain the first plate and the second plate in a spaced apart relationship so as to define a chamber, the spacer element having at least one orifice therein such that the chamber is in fluid communication with an external environment; and an actuator element coupled to at least one of the first and second plates to selectively cause deflection thereof, thereby changing a volume within the chamber so that a series of fluid vortices are generated and projected to the external environment from the at least one orifice of the spacer element;

wherein the spacer element comprises a pliant member configured to deflect in a bending motion in response to the deflection of the first and second plates.

* * * * *